United States Patent
Tanoue et al.

(10) Patent No.: US 6,815,647 B2
(45) Date of Patent: Nov. 9, 2004

(54) HEAT TREATMENT UNIT AND HEAT TREATMENT METHOD

(75) Inventors: Mitsuhiro Tanoue, Kumamoto (JP); Tetsuya Oda, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/350,012

(22) Filed: Jan. 24, 2003

(65) Prior Publication Data

US 2003/0121902 A1 Jul. 3, 2003

Related U.S. Application Data

(63) Continuation of application No. 09/672,878, filed on Sep. 29, 2000, now Pat. No. 6,534,750.

(30) Foreign Application Priority Data

Sep. 30, 1999 (JP) .......................................... 11-278431
Sep. 30, 1999 (JP) .......................................... 11-278438

(51) Int. Cl.⁷ ............................... H05B 3/68; F28F 7/00
(52) U.S. Cl. ................................ 219/444.1; 219/448.4; 165/80.4
(58) Field of Search ....................... 219/444.1, 445.1, 219/445.11; 118/724, 725; 165/80.2, 80.3, 80.4, 80.5

(56) References Cited

U.S. PATENT DOCUMENTS

| 4,518,848 A | 5/1985 | Weber |
| 4,956,043 A | 9/1990 | Kanetomo et al. |
| 5,150,253 A | * 9/1992 | Watanuki ..................... 359/360 |
| 5,252,807 A | * 10/1993 | Chizinsky ..................... 219/390 |
| 5,462,603 A | 10/1995 | Murakami |
| 5,683,606 A | 11/1997 | Ushikoshi et al. |
| 5,688,331 A | 11/1997 | Aruga et al. |
| 5,851,298 A | 12/1998 | Ishii |
| 5,904,872 A | 5/1999 | Arami et al. |
| 6,080,970 A | 6/2000 | Yoshida et al. |
| 6,087,632 A | 7/2000 | Mizosaki et al. |
| 6,097,005 A | * 8/2000 | Akimoto .................. 219/444.1 |

FOREIGN PATENT DOCUMENTS

JP      11-68026 A1    7/1989

* cited by examiner

Primary Examiner—Sang Paik
(74) Attorney, Agent, or Firm—Rader, Fishman & Grauer PLLC

(57) ABSTRACT

A heat treatment unit comprises a heat plate made of aluminum nitride which is excellent in heat conductivity and strength inside thereof. The entire circumference of the heat plate is supported by a supporting member which is excellent in thermal insulation. The heat treatment unit is equipped with a nozzle for blowing dry air against the reverse side of the heat plate. When a temperature of the heat plate is lowered, the dry air is blown from the nozzle, thereby quickly lowering the temperature of the heat plate.

8 Claims, 17 Drawing Sheets

HEAT TREATMENT UNIT AND HEAT TREATMENT METHOD

This application is a continuation application of Ser. No. 09/672,878 filed Sep. 29, 2000 now U.S. Pat. No. 6,534,750.

BACKGROUND OF THE INVENTION

1. Field of the Invention

The present invention relates to a heat treatment unit used to perform heat treatment on a substrate, and a heat treatment method.

2. Description of the Related Art

In a photo-resist treatment step in a process, of semiconductor device fabrication, various kinds of heat treatments, such as heat treatment after a resist-coating on the surface of a semiconductor wafer (described as "a wafer" hereinafter) called prebaking and heat treatment after an exposure of a pattern called post-exposure baking, are performed.

Such heat treatments are generally performed in a heat treatment unit. The heat treatment unit comprises a disk shaped heat plate with some thickness made of aluminum-in a treatment case, and performs heat treatment on the wafer by putting the wafer, which is to undergo heat treatment, on the-heat plate and then by heating the heat plate to a predetermined temperature by a heating element embedded in the heat plate.

Further, there is a case where a temperature during heat treatment varies corresponding to types of semiconductor device to be formed, resist solution and process, such as heating the wafer to 140° C. or heating the wafer to a lower temperature, 90° C., for example. In this case, when the heat plate which has been undergoing heat treatment at 140° C., for example, is changed to the one to be heated at 90° C., it is inevitable to once lower the temperature of the heat plate, for example, to 90° C. In such situations, a conventional heat treatment unit of this type is not especially provided with a mechanism for cooling, or the like.

SUMMARY OF THE INVENTION

It is necessary to vary the temperature of the heat plate since the heat treatment temperature varies corresponding to types of semiconductor device to be formed, resist solution and process. On this occasion, it is preferable to raise and lower the temperature of the heat plate quickly in order to improve a throughput in wafer fabrication.

However, heat exchange is not smoothly performed in, such a, manner that heat escapes from the outer peripheral portion of the heat plate and below the heat plate when the temperature of the heat plate is raised, and heat is accumulated in the heat treatment unit when the temperature of the heat plate is lowered, thereby requiring long time to raise and lower the temperature of the heat-plate.

In addition, when the heat plate is cooled to the predetermined temperature, heat is accumulated not only in a supporting member which supports the heat plate but also in an outer circumferential wall which surrounds an outer circumference of the supporting member if performed simply with spontaneous cooling, which is undesirable since considerably long time is required to make the temperature of the surface portions of the heat plate uniform after the heat plate is heated up to the predetermined temperature.

An object of the present invention is to provide a heat treatment unit in which a temperature of a heat plate can be raised and lowered quickly compared with the conventional heat treatment unit, and a heat treatment method.

A first aspect of the present invention is a heat treatment unit in which a substrate is heated on a heat plate, comprising a supporting member which supports at least the peripheral portion of the heat plate, material of the supporting member being thermal insulating material.

A second aspect of the present invention is a heat treatment unit in which a substrate is heated on a heat plate, comprising a supporting member which supports at least the peripheral portion of the heat plate, material of the supporting member being thermal insulating material, and further comprising gas supply means for blowing gas for cooling against the reverse side of the heat plate.

A third aspect of the present invention is a heat treatment unit in which a substrate is heated on a heat plate, comprising an outer circumferential wall surrounding the outer circumference of a supporting member which supports the heat plate, and a fin provided on the surface of the outer circumferential wall.

A fourth aspect of the present invention is a heat treatment unit in which a substrate is heated on a heat plate, comprising an outer circumferential wall surrounding the outer circumference of a supporting member which supports the heat plate, and a tube provided to have contact with the surface of the outer circumferential wall, in which fluid for cooling circulates.

A fifth aspect of the present invention is a method of heating with a substrate placed on a heat plate, comprising the steps of closing a space below the heat plate when the substrate is heated and opening the space below the heat plate when the heat plate is cooled.

According to the present invention, heat accumulated in the heat plate can be inhibited from dissipating from the outer peripheral portion of the heat plate since material of the supporting member is thermal insulating material, whereby a temperature of the heat plate can be raised quickly while the temperature of the surface portion of the heat plate can be kept uniform during heat treatment.

According to the present invention, by blowing gas for cooling against the reverse side of the heat plate, heat accumulated in the heat plate is rapidly diminished by the gas when the heat plate is cooled, thereby enabling the heat plate to be cooled more quickly than the conventional one.

Further, according to the present invention, heat capacity of the outer circumferential wall can be decreased by, virtue of the fin provided on the surface of the outer circumferential wall. Furthermore, the surface area of the outer circumferential wall is increased, which improves the heat-dissipation efficiency of heat which is accumulated in the outer circumferential wall. As a result, the heat plate supported by the supporting member can be more quickly cooled than the conventional one.

According to the present invention, heat accumulated in the outer circumferential wall is rapidly diminished since a tube, in which fluid for cooling circulates, is provided, thereby improving a speed of lowering the temperature of the heat plate arranged inside of the outer circumferential wall, compared with the conventional one.

According to the present invention, when the substrate is heated, the substrate can be heated at a predetermined temperature by closing a space below the heat plate to retain heat therein, which makes it possible to raise the temperature more quickly than the conventional one. When the heat plate is cooled, it is possible to lower the temperature more quickly than the conventional one since the space below is opened. Therefore, it takes less time to change setting of temperature of the heat plate, resulting in the improvement of a throughput.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENT

Figure 1:
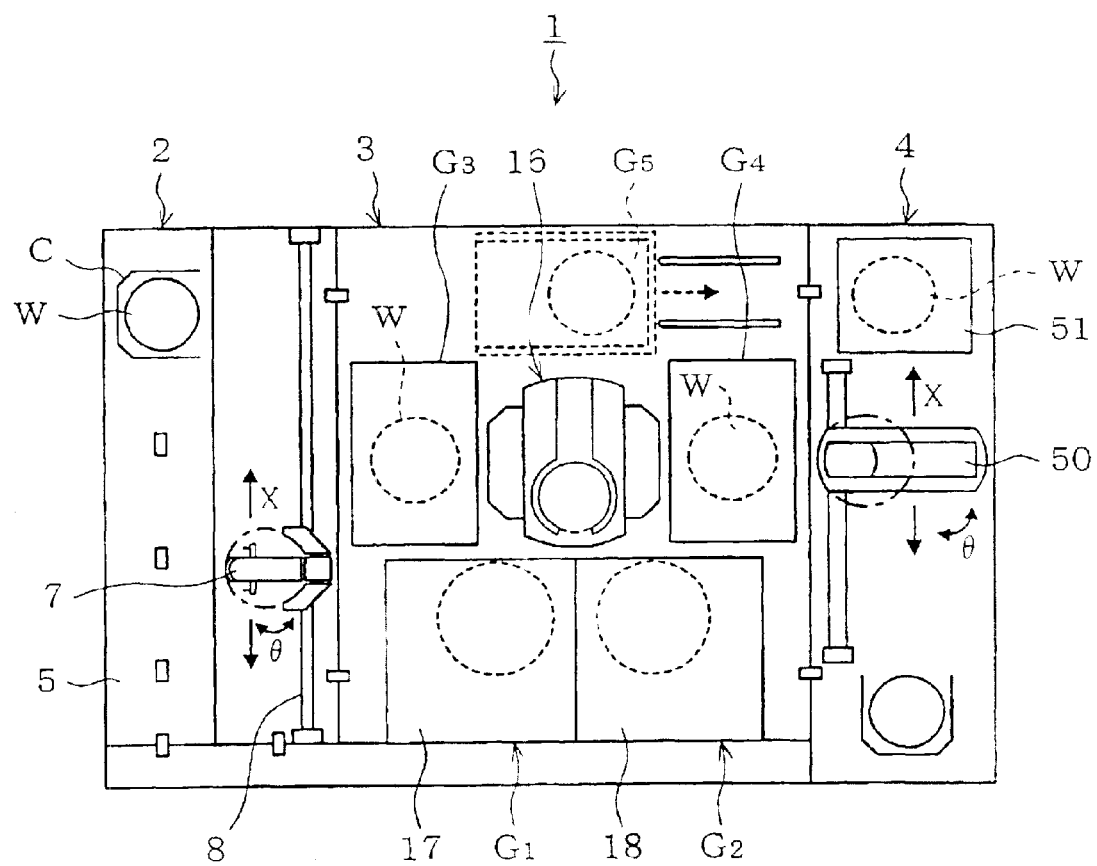
FIG. 1 is a plane view showing an appearance of a coating and developing system provided with a post-exposure baking unit according to the present invention.
Figure 2:
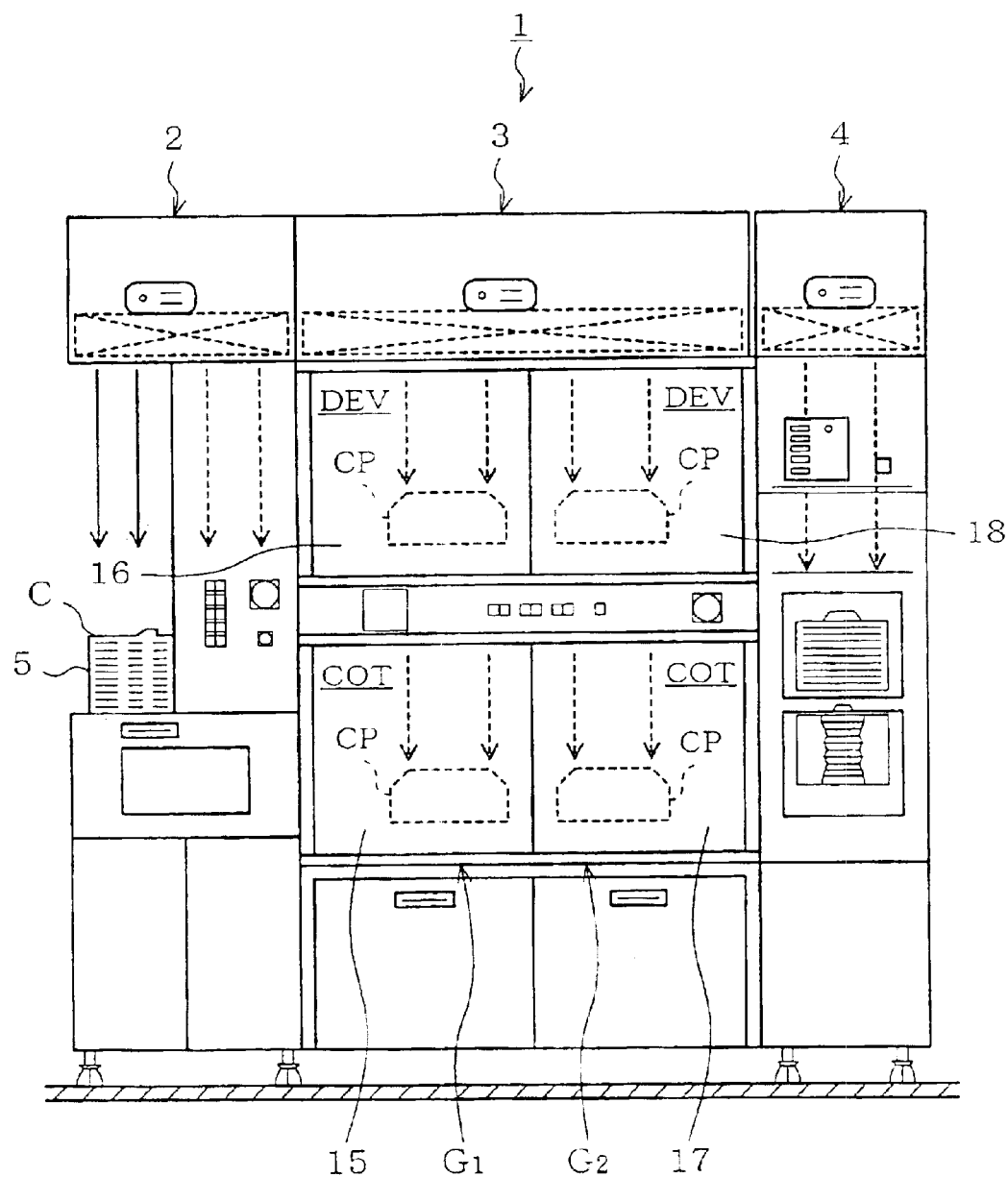
FIG. 2 is a front view of the coating and developing system in FIG. 1.
Figure 3:
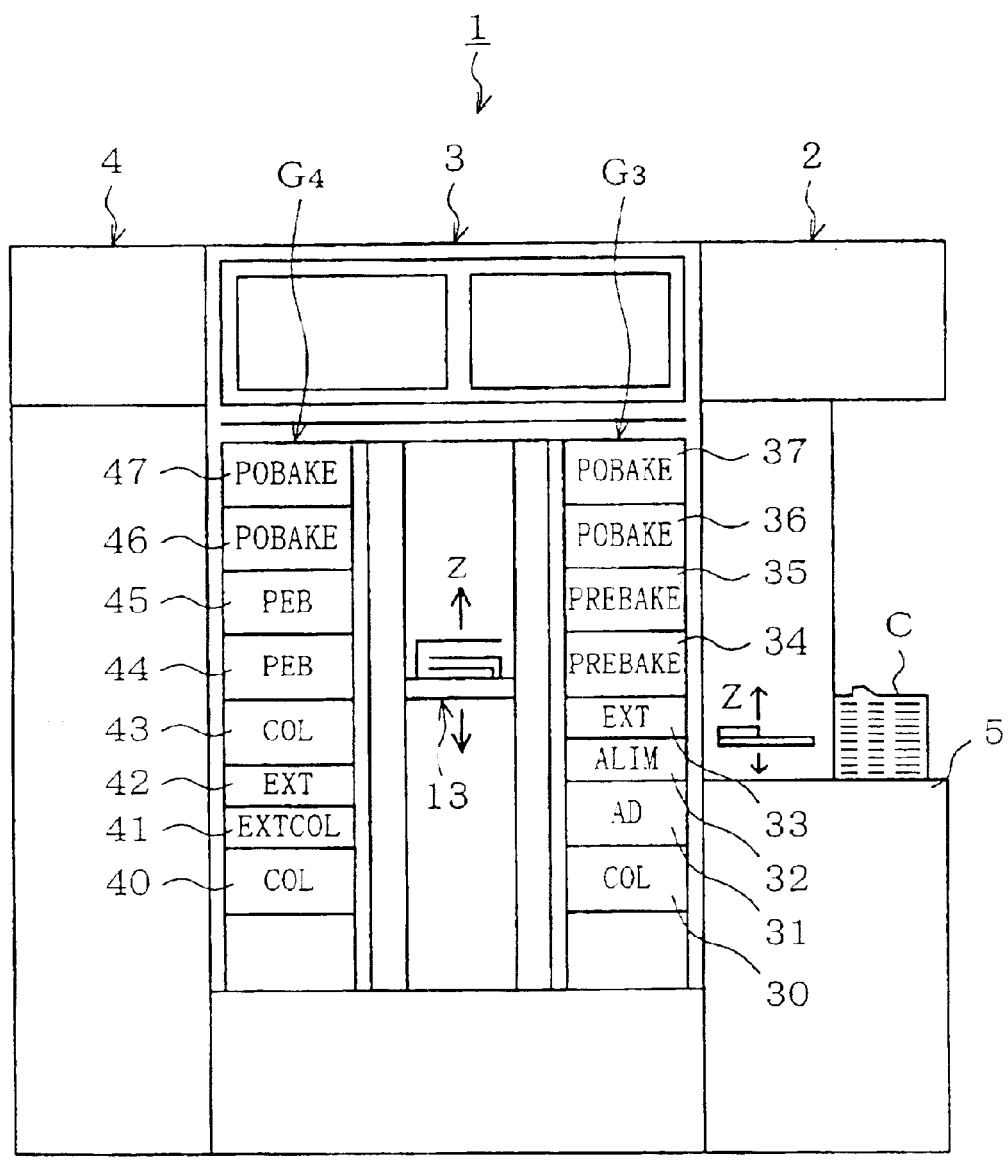
FIG. 3 is a rear view of the coating and developing system in FIG. 1.

A preferred embodiment of the present invention will be described below with reference to the accompanying drawings. FIG. 1 is a plane view of a coating and developing system 1 comprising a post-exposure baking unit as a heat treatment unit according to the embodiment. FIG. 2 is a front view of the coating and developing system 1 and FIG. 3 is a rear view of the coating and developing system 1.

As shown in FIG. 1, the coating and developing system 1 has a structure in which a cassette station 2 for carrying, for example, 25 wafers from/to the outside to/from the coating and developing system 1 in the unit of cassette and for carrying the wafers W into/from a cassette C, a process station 3 in which various kinds of multi-tiered treatment units for performing predetermined treatments one by one in the coating and developing process are disposed, and an interface section 4 for receiving and delivering the wafer W from/to an aligner which is not shown and provided adjacent to the process station 3, are integrally connected.

In the cassette station 2, a plurality of cassettes C are well mounted at predetermined positions on a cassette mounting table 5 serving as a mounting portion in a line in an X-direction (a vertical direction on FIG. 1). Further, a wafer carrier 7, which is transferable in the direction of alignment of the cassettes (the X-direction) and in the direction of alignment of the wafers W housed in the cassette C (a Z-direction; a vertical direction), is provided to be movable along a carrier guide 8 and is selectively accessible to the respective cassettes C.

The wafer carrier 7 is structured so as to access also an alignment unit 32 and an extension unit 33 which are included in a third treatment unit group G3 on the side of the process station 3 as will be described later.

In the process station 13, a main carrier unit 13 is provided in the center part thereof, and various kinds of treatment units are multi-tiered on the periphery of the main carrier unit 13 to compose treatment unit groups. In the coating and developing system 1, there are four treatment unit groups G1, G2, G3, and G4, and the first and the second treatment unit groups G1, G2 are disposed on the front side of the coating and developing system 1, the third treatment unit group G3 is disposed adjacent to the cassette station 2, and the fourth treatment unit group G4 is disposed adjacent to the interface section 4. Further, as an option, a fifth treatment unit group G5 depicted by broken lines can be additionally arranged on the rear side of the coating and developing system 1.

In the first treatment unit group GI, as shown in FIG. 2, two kinds of spinner-type treatment units, for example, a resist coating unit 15 in which the wafer W undergoes resist coating, and a developing unit 16 in which the wafer W undergoes treatment with a developing solution supplied are two-tiered in the order from the bottom. Also in the case of the second treatment unit group G2, a resist coating unit 17 and a developing unit 18 are similarly two-tiered in the order from the bottom.

In the third treatment unit group G3, as shown in FIG. 3, a cooling unit 30 for cooling the wafer W, an adhesion unit 31 for increasing the fixability between a resist solution and the wafer W, the alignment unit 32 for aligning the wafer W, the extension unit 33 for keeping the wafer W waiting, prebaking units 34, 35 for drying a thinner solution after the resist coating, and postbaking units 36, 37 for performing heat treatment after developing and so on are, for example, eight-tiered in the order form the bottom.

In the fourth treatment unit group G4, a cooling unit 40, an extension and cooling unit 41 for spontaneously cooling the housed wafer W, an extension unit 42, a cooling unit 43, post-exposure baking units 44, 45 according to the embodiment for performing heat treatment after exposure treatment, and postbaking units 46, 47 and so on are, for example, eight-tiered in the order from the bottom.

Then, a wafer carrier 50 is provided in the center part of the interface section 4. The wafer carrier 50 is structured so as to be movable in the X-direction (the vertical direction on FIG. 1) and the Z-direction (the vertical direction), and to be rotatable in a θ direction (a rotational direction about an axis Z), so that it can smoothly access the extension and cooling unit 41, the extension unit 42 which are included in the fourth treatment unit group G4, a peripheral aligner 51, and the aligner which is not shown.

Figure 4:
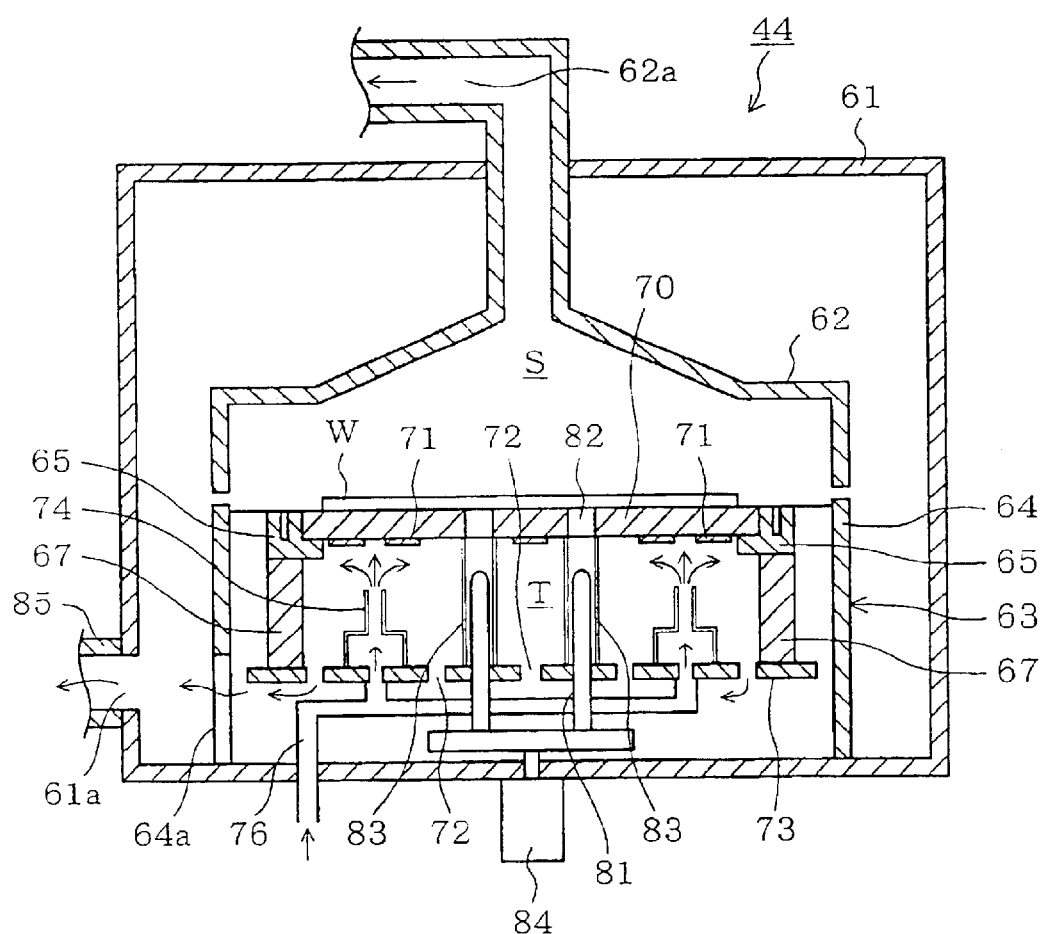
FIG. 4 is an explanatory view of a vertical section of the post-exposure baking unit according to the present invention.

Next, the post-exposure baking unit 44 serving as the heat treatment unit will be described in detail. As shown in FIG. 4, in a casing 61, the post-exposure baking unit 44 is composed of a lid body 62 which is disposed on the upper side of the casing and vertically movable, and a heat plate accommodating portion 63 which is positioned on the lower side thereof and forms a treatment chamber S integrally with the lid body 62.

The lid body 62 has a substantially conical shape in which the height thereof is gradually increased toward its center, and is provided with an exhaust portion 62a at the top portion thereof so that an atmosphere in the treatment chamber S is uniformly exhausted through the exhaust portion 62a.

The heat plate accommodating portion 63 comprised an external case 64 of substantially cylindrical shape, a disk-shaped heat plate 70 disposed in the case 64, and a support 65 serving as a supporting member which supports the peripheral portion of the heat plate 70 and is made of polyimide-base or fluorine-base synthetic resin which is excellent in thermal insulation such as PBI (polybenzoimidazole) and PTFE (polytetrafluoroethylene).

Figure 5:
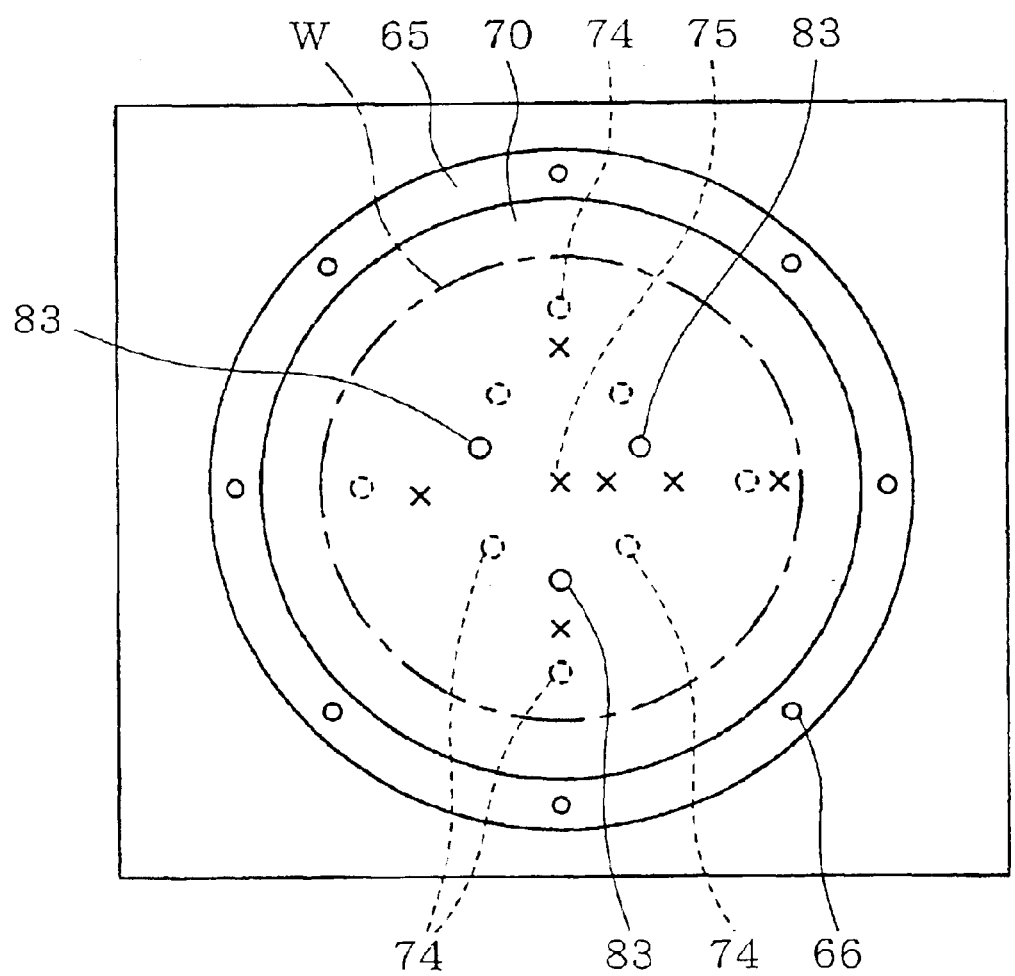
FIG. 5 is an explanatory view of the post-exposure baking unit according to the present invention, viewing its plane state.

The support 65 is formed in the shape of a ring so as to closely come into contact with the entire peripheral portion of the heat plate 70. Further, fluorine synthetic resin known as thermal insulating material is used, thereby inhibiting heat of the heat plate 70 from dissipating from the peripheral portion of the heat plate in the heat treatment process. Therefore, the wafer W placed on the heat plate 70 is uniformly heated since the temperature of the surface portion of the heat plate 70 is kept uniform. Incidentally, the support 65 is supported with cylindrical supporting stands 67. Moreover, the support 65 is provided with blow-out ports 66 as depicted in FIG. 5, whereby it is possible to blow, for example, air, inactive gas or the like toward the inside of the treatment chamber S.

The heat plate 70 is made of, for example, aluminum nitride which is excellent in heat conductivity and strength so as to be quickly raised and lowered the temperature thereof and to be made thin, and the thickness thereof is, for example, 3 mm which is thinner than the conventional one.

On the reverse side of the heat plate 70, a heater, for example, in which a heating wire is wound on a copper plate as that in the conventional one, is not embedded, but a heater 71 made of silver which generates heat by an electric feed is, for example, concentrically printed as heat source. Therefore, the thickness of the heater 71 is nearly zero, and even if with the heat plate 70 added, it is about 3 mm which is thin.

Below the heat plate 70, attached is a base plate 73 with holes provided with a large number of venting portions 72 such as, for example, a punching metal, to form a space section T surrounded with the base plate 73, the heat plate 70, and the support 65.

On the base plate 73, nozzles 74, which blow gas for cooling, for example, air at room temperature such as 23° C. toward the reverse side of the heat plate 70 in a vertical direction, are provided at, for instance, eight positions. As shown in FIG. 5, each four of the nozzles 74 are concentrically arranged and the arrangement thereof is set not to overlap with the positions of temperature sensors 75 for measuring a temperature of the heat plate 70 (depicted by x in FIG. 5) when viewing its plane state. Each of the nozzles 74 is connected by an air supply duct 76, and respective air having the same wind speed is to be blown against the reverse side of the heat plate 70 from each of the nozzles 74 when the air is supplied from the outside of the casing 61. Incidentally, as for the air, it is preferable to use dry air with low humidity or the like.

On the heat plate 70, holes 82, through which three hoisting and lowering pins 81 for hoisting and lowering the wafer W project from the upper surface of the heat plate 70, are provided at three portions. Moreover, between the respective holes 82 and the base-plate 73, vertically disposed are respective cylindrical guides 83 for isolating an atmosphere from the nozzles 74 by covering the outer circumference of the hoisting and lowering pins 81. By virtue of these guides 83, the vertical movement of the hoisting and lowering pins 81 is not affected by various cables or the like wired beneath the heat plate 70, and additionally, the air which is blown from the nozzles 74 can be prevented from discharging through the holes 82 toward the wafer W. Incidentally, hoisting and lowering pins 81 are vertically movable by an appropriate drive unit 84 such as an electric motor.

An appropriate exhaust port 64a is provided on the circumference of the lower portion of the case 64, while an appropriate exhaust port 61a is also formed correspondingly on the side of the lower portion of the casing 61 in the post-exposure baking unit 44, and the exhaust port 61a is connected with an exhaust duct 85 leading to an exhaust portion (not shown) which intensively exhausts air from other treatment units in the coating and developing system 1.

Next, a function of the post-exposure baking unit 44 serving as a heat treatment unit as structured above will be described together with a coating and developing process for the wafer W performed in the coating and developing system 1.

First, the wafer carrier 7 takes out an unprocessed wafer W from the cassette C to carry it into the alignment unit 32 included in the third treatment unit group G3. Second, the wafer, of which alignment is completed by the alignment unit 32, is sequentially transferred to the adhesion unit 31, the cooling unit 30, the resist coating unit 15 or 17, and the prebaking unit 34 or 35 by the main carrier unit 13, to undergo predetermined treatment. After that, the wafer W is transferred to the extension and cooling unit 41.

Then, the wafer W is taken out of the extension and cooling unit 41 by the wafer carrier 50, and thereafter, transferred through the peripheral aligner 51 to the aligner which is not shown. The wafer W, of which exposing treatment is completed, is transferred to the extension unit 42 by the wafer carrier 50 and held in the main carrier unit 13 thereafter. And subsequently, the wafer W is, transferred to the post-exposure baking unit 44 or 45.

Next, traces of the wafer W in the post-exposure baking unit 44 will be explained in detail.

First, the wafer W which has completed its pretreatment is carried into the post-exposure baking unit 44 by the wafer carrier 50 and is delivered to the hoisting and lowering pins 81 which ascend and keep waiting in advance. Then, the wafer W comes down in accordance with the descent of the hoisting and lowering pins 81 and is located on the heat plate 70. At this time, the wafer W is heated up to 140° C. by means of heat with, for example, the heater 71. Incidentally, in this heating process, a solvent or the like which is evaporated from the surface of the wafer is exhausted from the exhaust port 62a. After heating of prescribed time, the hoisting and lowering pins 81 again ascend to support the wafer and leave it with the main carrier unit 13 so that the wafer is carried out to the outside of the post-exposure baling unit 44.

Now, turning to a temperature of the post-exposure baking after exposure varies corresponding to types of process, resist and so on. In fact, there is a case of not only heating at 140° C. as described above, but also heating at a lower temperature, for example, at 90° C. In this case, it is inevitable to quickly cool the heat plate 70 to make preparations for heating at 90° C., and the post-exposure baking unit 44 according to the present embodiment can desirably cope with such lowering of the temperature of the heat plate.

Figure 6:
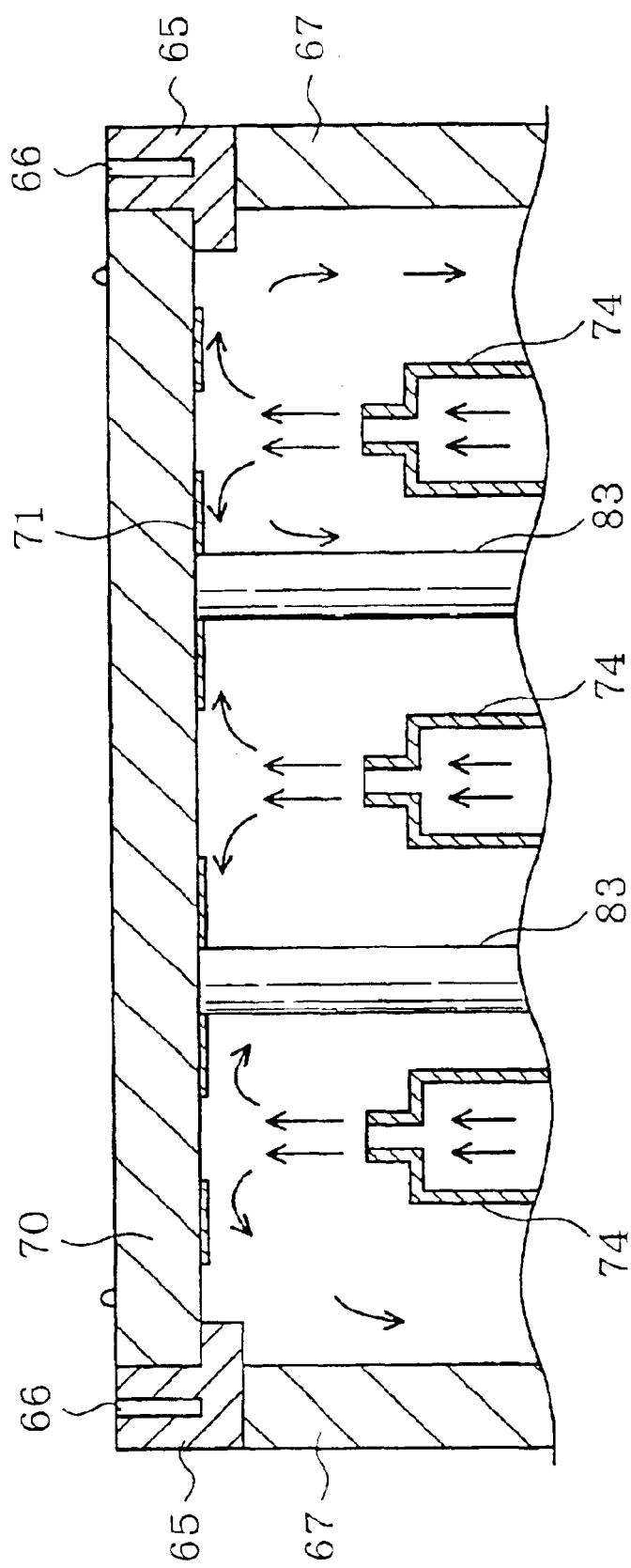
FIG. 6 is an explanatory view showing a state where gas is blown against the reverse of a heat plate in the post-exposure baking unit according to the present invention, taking its side view.

More specifically, after the completion of heat treatment of the wafer W which is the last one of a lot that is to undergo heat treatment at 140° C., air at room temperature is blown against the reverse side of the heat plate 70 from the nozzles 74, as shown in FIG. 6.

Then, the heat plate 70 is cooled immediately by the air at room temperature which is blown against the reverse thereof, since the heat plate 70 is formed to be thin by the use of aluminum nitride which is excellent in heat conductivity.

Conversely, there is also a case where the wafer is heated at 280° C. depending on a recipe. In this case, it is necessary to quickly heat the heat plate 70 to make preparations for heating at 280° C. Since the heat plate 70 with excellent heat conductivity is used as described above, and besides, the heat plate 70 is supported by the support 65 having the excellent thermal insulation property, whereby the temperature of the heat plate 70 can be raised quickly by the heater 71 printed on the underneath surface thereof than the conventional one.

According to the above-mentioned embodiment, in the heat treatment process in the post-exposure baking unit 44, heat of the heat plate 70 is inhibited from dissipating since the heat plate 70 is supported by the support 65 made of thermal insulating material, thereby improving a speed of raising the temperature of the heat plate 70 while keeping the temperature of the surface portion of the heat plate 70 uniform so as to uniformly heat the wafer W.

Further, since the heat plate 70 is formed thinner than the conventional one and aluminum nitride having excellent heat conductivity is used for its own material, the heat plate 70 increases responsiveness thereof and can be raised and lowered quickly the temperature thereof. Furthermore, the heat plate 70 is made thin, whereby the entire post-exposure baking unit 44 can be compact.

The venting portions 72 of the base plate 73 which forms the space section T below the heat plate 70 described above are permanently opened, but they can be so modified that the venting portions 72 are occasionally opened and closed by attaching appropriate cover members or the like thereto to shut the space section T. The space section T is opened and closed upon necessity as described above, so that when the wafer W undergoes heat treatment, the venting portions 72 are closed to retain heat inside of the space section T, thereby performing heat treatment on the wafer W with stability at a predetermined temperature. Moreover, when the temperature of the heat plate 70 is raised, it is possible to raise the temperature quickly since heat-dissipation from the space section T can be prevented by closing the venting portions 72. On the other hand, when the heat plate 70 is cooled, heat can be quickly escaped by opening-the space section T.

Figure 7:
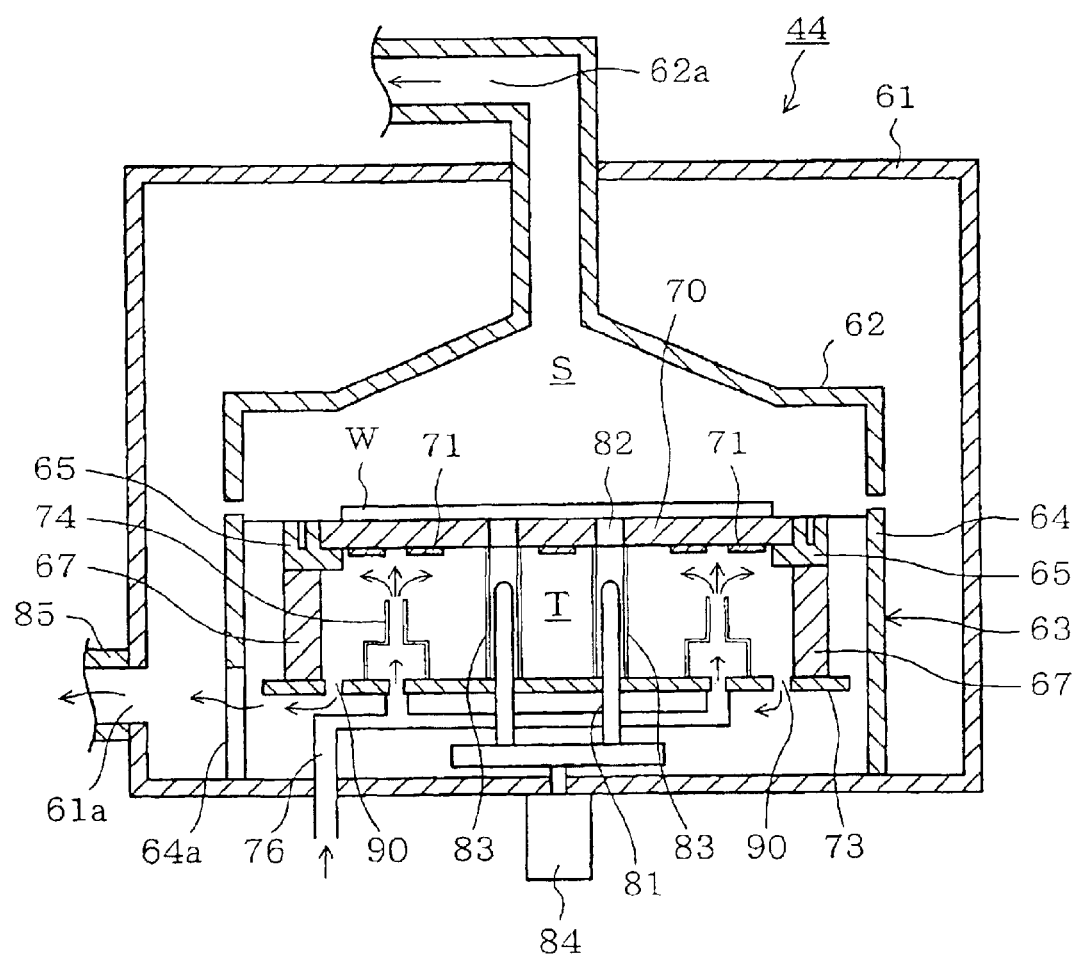
FIG. 7 is an explanatory view of a vertical section of the post-exposure baking unit in the case of providing venting portions on the peripheral portion of a base plate below the heat plate.
Figure 8:
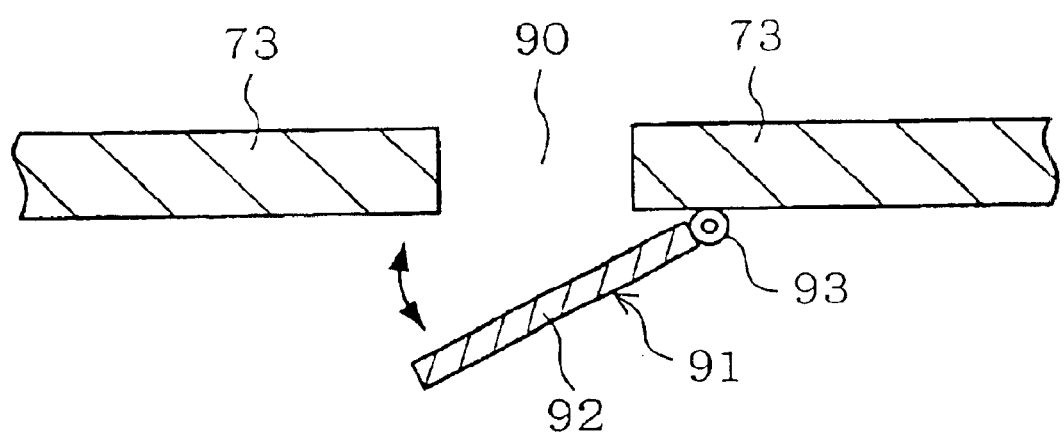
FIG. 8 is an enlarged explanatory view in the case of attaching cover members to the venting portions of the base plate below the heat plate in the post-exposure baking unit in FIG. 7.

In order to realize such function, venting portions 90, for example, are provided on the peripheral portion of the base plate 73 forming the space section T below the heat plate 70 as shown in FIG. 7 and relief valves 91 are attached as shown in FIG. 8. The relief valves 91 have cover members 92 flexibly opening and closing the venting portions 90 and are rotatable about rotating portions 93. Additionally, the cover members 92 are biased by urging members (not shown) such as springs so as to close the venting portions 90 in a primary state. By the relief valves 91 having such structure, the venting portions 90 are opened against biasing pressure of the urging members when pressure from above, that is, from the space section T is exerted. Namely, in the case of lowering the temperature of the heat plate 70, when gas for cooling is blown from the nozzles 74, internal pressure of the space section T rises, thereby opening the cover members 92 and releasing heat together with outflow of the gas. On the other hand, when the temperature of the heat plate 70 is raised or during the heat treatment process, outflow of the gas from the nozzles 74 is brought to stop, whereby the cover members 92 close the venting portions 90 by urging pressure to prevent heat of the heat plate 70 from escaping. As a result, raising and lowering of the temperature of the heat plate 70 is expedited, which makes it possible to more quickly raise and lower the temperature of the heat plate 70. Incidentally, it should not be limitedly understood that a relief valve which realizes the above-mentioned function has the structure as is shown in the relief valve 91.

Additionally, although the aforesaid present embodiment is realized as a heat treatment unit capable of performing post-exposure baking, other heat treatment units such as prebaking unit and the like can be naturally employed. Further, although a substrate is the wafer W in the above, it is also applicable to heat treatment units with other rectangular substrates, for example, an LCD substrate.

By contacting the support 65 closely with the heat plate 70 to support the entire circumference of the heat plate 70, heat from the heat plate 70 is inhibited from dissipating, thereby raising the temperature of the heat plate 70 quickly, and additionally improving the uniformity of the surface temperature of the heat plate 70.

Since material of the heat plate 70 is of aluminum nitride, heat conductivity is improved and the temperature of the heat plate 70 can be raised and lowered quickly than the conventional one. Moreover, since aluminum nitride is more excellent also in strength compared with aluminum used conventionally, the heat plate 70 can be made thin in thickness, which makes it possible to increase the responsiveness to heat, and raise and lower the temperature of the heat plate 70 quickly.

It takes less time to change setting of temperature than that in the conventional one, resulting in a contribution to the improvement of a throughput. In addition, since the uniformity of the surface temperature of the heat plate is improved, an increase in yield can be also expected.

Figure 9:
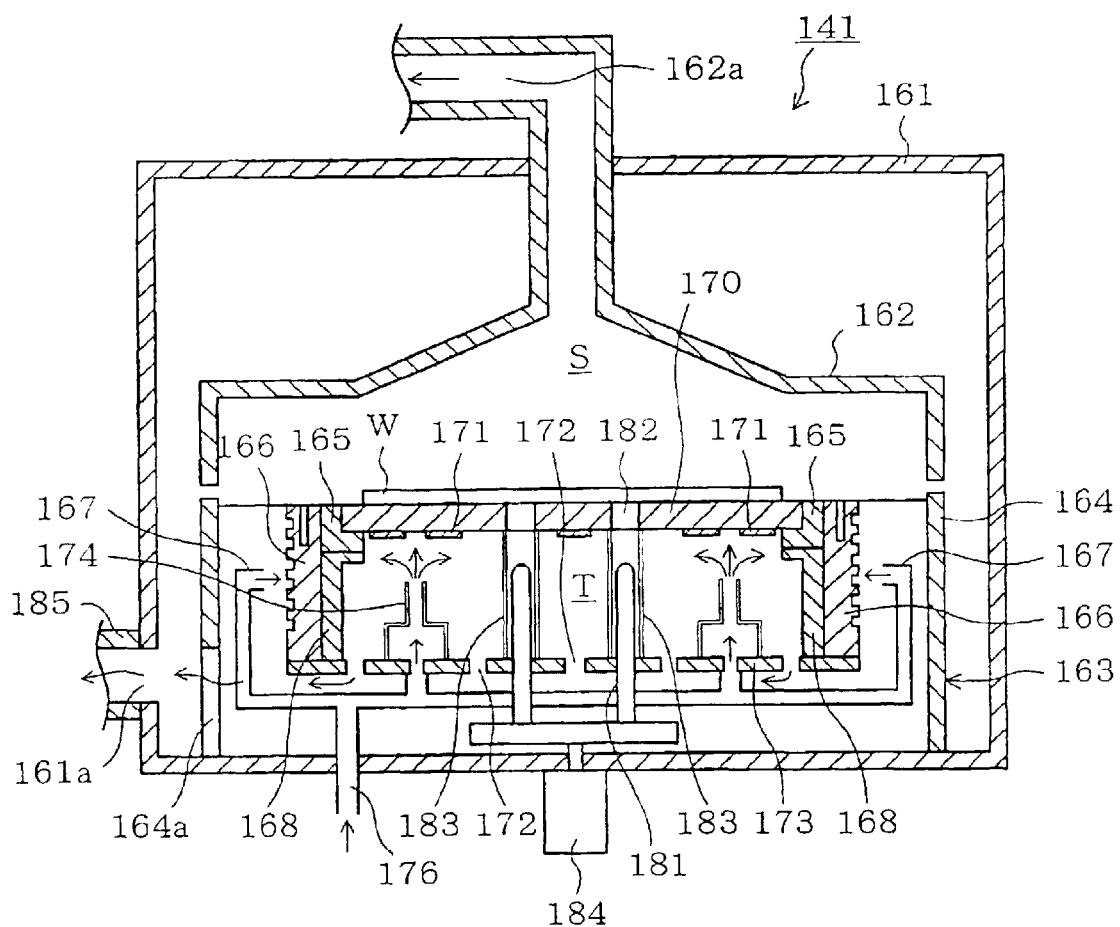
FIG. 9 is a sectional explanatory view of a post-exposure baking unit according to another embodiment of the present invention, taking its side view.

Next, another embodiment of the present invention will be described hereunder. As shown in FIG. 9, in a casing 161, a post-exposure baking unit 141 is composed of a lid body 162 which is disposed on the upper side of the casing and movable upward and downward, and a heat plate accommodating portion 163 which is positioned on the lower side thereof and forms a treatment chamber S integrally with the lid body 162.

The lid body 162 has a substantially conical shape in which the height thereof is gradually increased to its center, and is provided with and exhaust portion 162a at the top portion thereof, so that an atmosphere in the treatment chamber S is uniformly exhausted through the exhaust portion 162a.

The heat plate accommodating portion 163 comprises a disk-shaped heat plate 170 in the center thereof, a support 165 serving as a supporting member which supports the peripheral portion of the heat plate 170 and is excellent in thermal insulation, an outer supporting member which supports the peripheral portion of the heat plate 170 and is excellent in thermal insulation, an outer circumferential wall 166 of substantially cylindrical shape which surrounds the outer circumference of the support 165 and a substantially cylindrical case 164 surrounding the outer circumference of the heat plate accommodating portion 163. The support 165 is supported with supporting stands 168 of substantially cylindrical shape.

Figure 10:
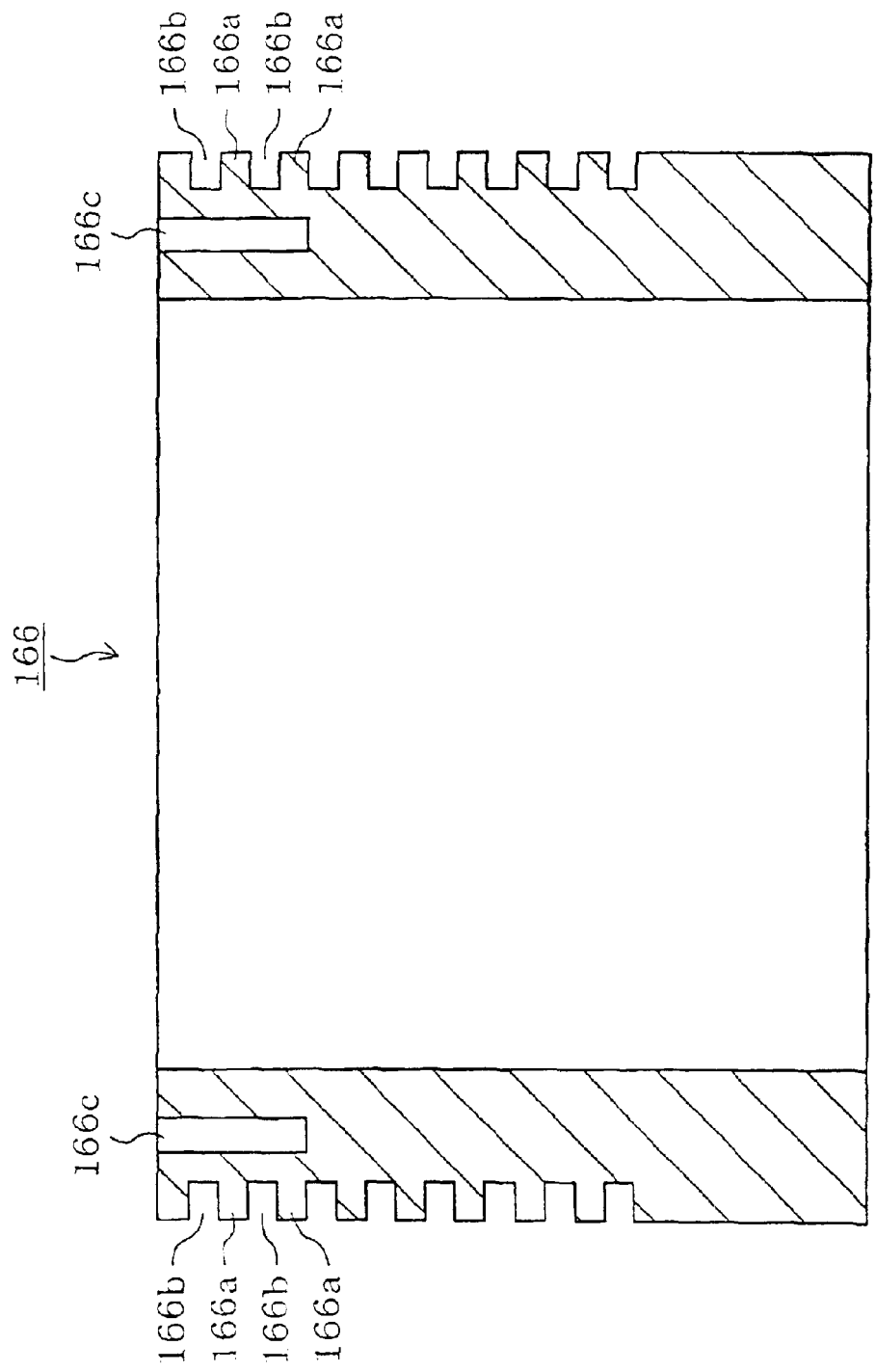
FIG. 10 is an explanatory views of a vertical section of an outer circumferential wall in the post-exposure baking unit in FIG. 9.

The outer circumferential wall 166 is made of, for example, aluminum and has a shape of almost cylinder as shown in FIG. 10. On the outside surface of the outer circumferential wall 166, provided are ring-shaped groove portions 166b, to thereby form fins 166a for decreasing heat capacity of the outer circumferential wall 166 and increasing the surface area thereof. A plurality of the groove portions 166b are formed with a predetermined width and a predetermined depth along the circumference of the outer circumferential wall 166. The groove portions 166b are provided parallel to each other at equally spaced intervals. As a consequence, an amount of heat accumulated in the outer circumferential wall 166 is decreased and at the same time the heat-dissipation efficiency is improved. On the upper surface of the outer circumferential wall 166, provided are blow-out ports 166c, which makes it possible to blow, for example, air, inactive gas or the like toward the inside of a treatment chamber S.

Further, nozzles 167, which blow gas for cooling, for example, dry air at room temperature against the fins 166a in the direction of the center of the outer circumferential wall 166, are provided in a loop at eight portions between the outer circumferential wall 166 and the case 164. Each of the nozzles 167 is connected by an air supply duct 176. When air is supplied from the outside of the casing 161, respective dry air at the same wind speed are blown against the fins 166a on the outer circumferential wall 166 from the respective nozzles 167.

The heat plate 170 supported by the support 165 is made of, for example, aluminum and provided with a heater 171 generating heat by an electric feed on the reverse thereof. Beneath the supporting stands 168 which support the support 165, attached is a punched base plate 173 provided with a large number of venting portions 172, such as a punching metal.

Figure 11:
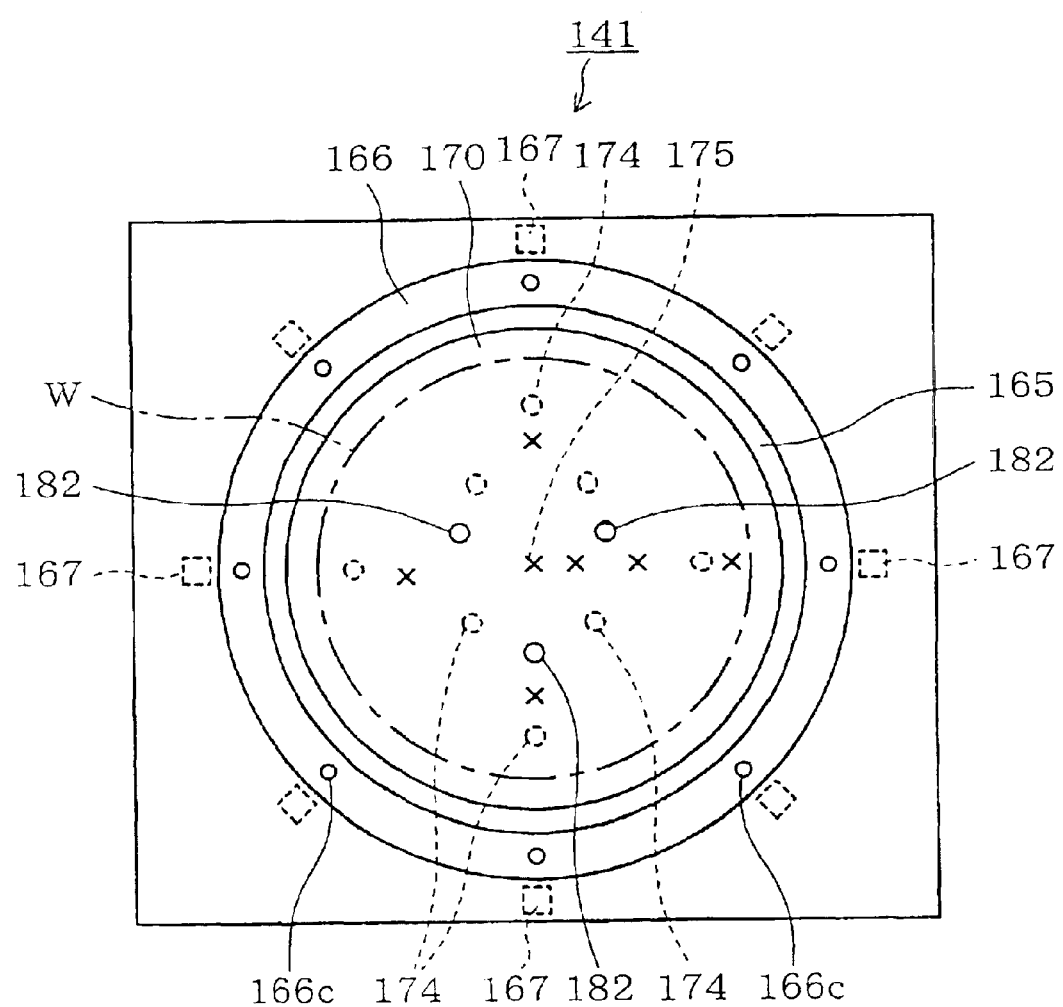
FIG. 11 is an explanatory view of the post-exposure baking unit according to another embodiment of the present invention, viewing its plane state.

On the base plate 173, nozzles 174, which blow gas for cooling, for example, dry air at room temperature against the reverse side of the heat plate 170 in a vertical direction, are provided at eight positions. Each four of the nozzles 174 are concentrically arranged and the arrangement thereof is set not to overlap with the positions of temperature sensors 175 for measuring a temperature of the heat plate 170 (depicted by x in FIG. 11) when viewing its plane state. Each of the nozzles 174 is connected by the air supply duct 176 similarly to the above-described nozzles 167 which blow gas against the fins 166a on the outer circumferential wall 166, and respective air at the same wind speed is to be blown against the reverse side of the heat plate 170 from the respective nozzles 174 when air is supplied from the outside of the casing 161.

On the heat plate 170, holes 182, through which three hoisting and lowering pins 181 for hoisting and lowering the wafer W project from the upper surface of the heat plate 170, are provided at three portions. Between the respective holes 182 and the base plate 173, vertically disposed are respective cylindrical guides 183 for isolation an atmosphere from the nozzles 174 by covering the outer circumference of the hoisting and lowering pins 181. By virtue of these guides 183, the vertical movement of the hoisting and lowering pins 181 is not affected by various cords or the like wired beneath the heat plate 170, and additionally, the air blown from the nozzles 174 can be prevented from discharging through the holes 182 toward the wafer W. Incidentally, hoisting and lowering pins 181 are vertically movable by an appropriate drive unit 184 such as an electric motor.

An appropriate exhaust port 164a is provided on the circumference of the lower portion of the case 164, while an appropriate exhaust port 161a is also formed correspondingly on the side of the lower portion of the casing 161 in the post-exposure baking unit 141, and the exhaust port 161a is connected with an exhaust duct 185 leading to an exhaust portion (not shown) which intensively exhausts air from other treatment units in the coating and developing system 1.

The post-exposure baking unit 141 according to the present embodiment is structured as above and has a function of performing post-exposure baking after exposure of pattern is carried out in an aligner (not shown) adjacent to the coating and developing system 1. More specifically, the wafer W, of which exposing treatment is completed, is placed on the heat plate 170 by the hoisting and lowering pins 181, and thereafter the wafer W is heated to 140° C. by heating of, for example, the heater 171. Then, when heating of prescribed time is finished, the hoisting and lowering pins 181 ascend to support the wafer W. After that, the wafer W is sent to the main carrier unit 13 and then transferred to the cooling unit 40.

Now, turning to a temperature of the post-exposure baking after exposure varies corresponding to types of process, resist and so on. In fact, there is a case of not only heating at 140° C. as described above, but also heating at a lower temperature, for example, at 90° C. In this case, it is inevitable to quickly cool the heat plate 170 to make preparations for heating at 90° C., and the post-exposure baking unit 141 in the present embodiment can desirably cope with such lowering of the temperature of the heat plate 170.

Figure 12:
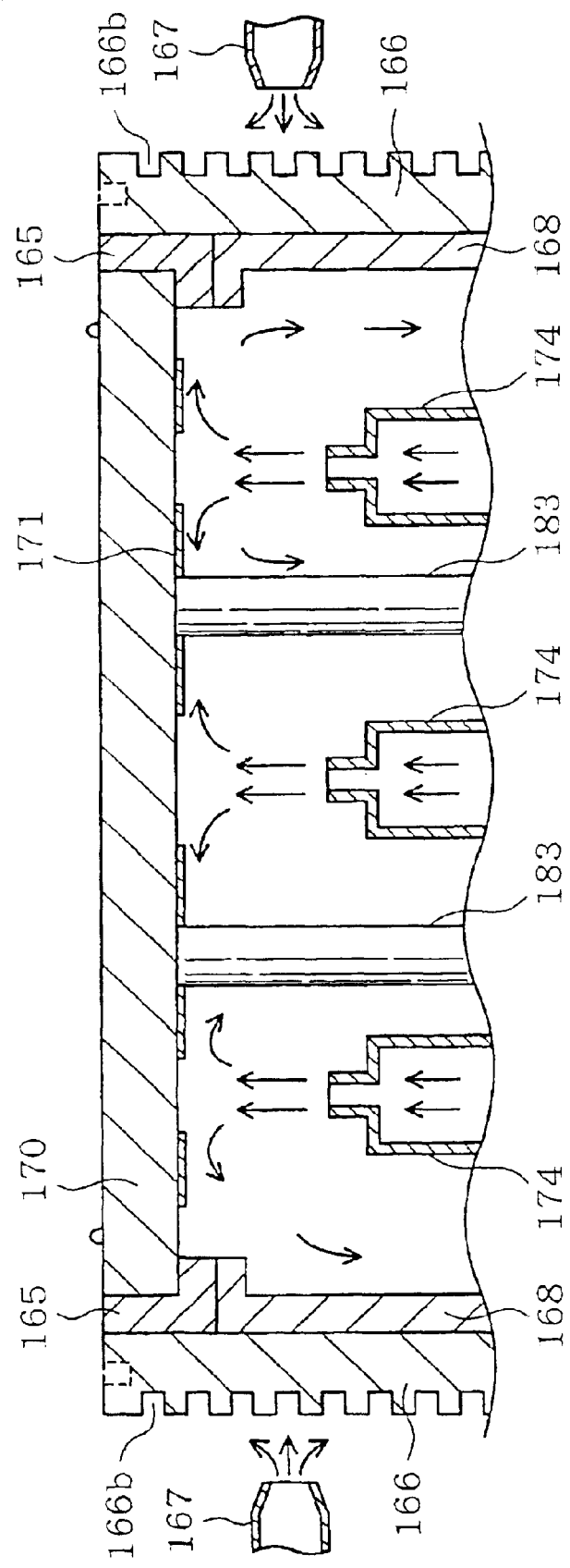
FIG. 12 is an explanatory view showing a state where air is blown against the reverse of a heat plate and against the outer circumferential wall in the post-exposure baking unit according to another embodiment of the present invention, taking its side view.

To be more specific, after the completion of heat treatment of the wafer W which is the last one of a lot that is to undergo heat treatment at 140° C., air is supplied from the outside of the casing 161, and through the air supply duct 176, air at room temperature is blown against the reverse side of the heat plate 170 from the nozzles 174, and dry air at room temperature is similarly blown against the fins 166a on the outer circumferential wall 166 as shown in FIG. 12.

Then, the heat plate 170 and the outer circumferential wall 166 of which heat efficiency is improved by forming fins 166a thereon are cooled by the dry air at room temperature which is blown thereagainst. Accordingly, heat, which is accumulated in the outer circumferential wall 166 while heat treatment is performed at 140° C., is diminished by the blown air, whereby the temperature of the heat plate 170 can be more quickly lowered than the conventional type in which an outer circumferential wall 166 is not provided with groove portions 166b and in addition air is not blown. Therefore, it takes less time to change setting of temperature, resulting in the improvement of a throughput.

Figure 13:
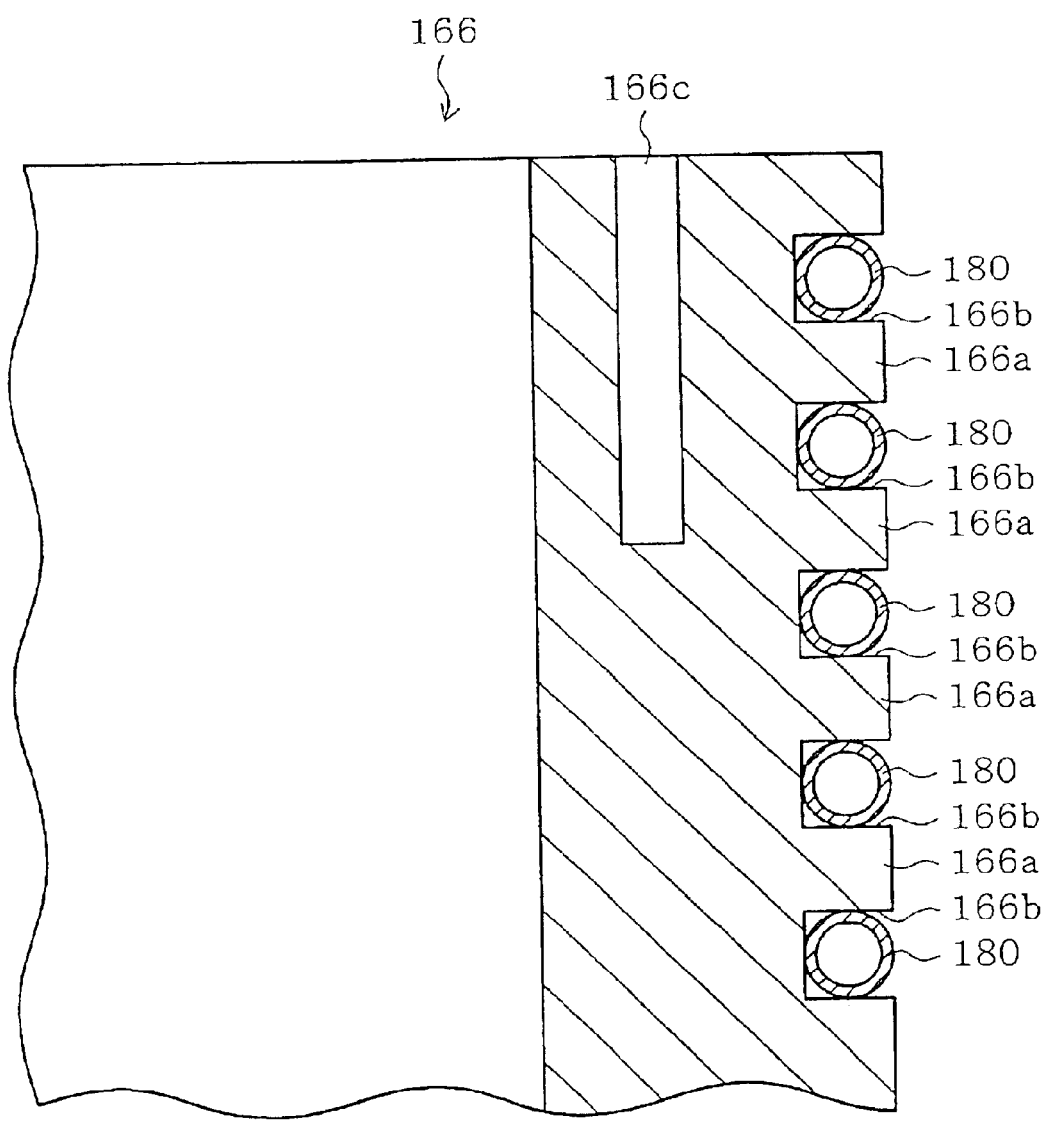
FIG. 13 is an enlarged explanatory view explaining a case of providing tubes, in which fluid for cooling circulates, in groove portions on the outer circumferential wall in the post-exposure baking unit according to another embodiment of the present invention.

In the aforementioned embodiment, the groove portions 166b on the outer circumferential wall 166 can be provided with tubes 180 made of, for example, aluminum with excellent heat conductivity, through which fluid for cooling circulates, to cool the outer circumferential wall 166, as shown in FIG. 13. Alternatively, only the tubes 180 may be provided to have contact with the surface of the outer circumferential wall 166 without providing such groove portions 166b on the outer circumferential wall 166, which also makes it possible to more quickly decrease heat accumulated in the outer circumferential wall 166, compared with the conventional one. Incidentally, both liquid such as water and gas such as air may be used for fluid flowing in the tubes 180. When air is used, air or dry air, which is supplied from the air supply duct 176 and blown against the reverse side of the heat plate as described above, may be used. As for material of tubes 180, a metal with excellent heat conductivity, for example, aluminum is recommended.

Figure 14:
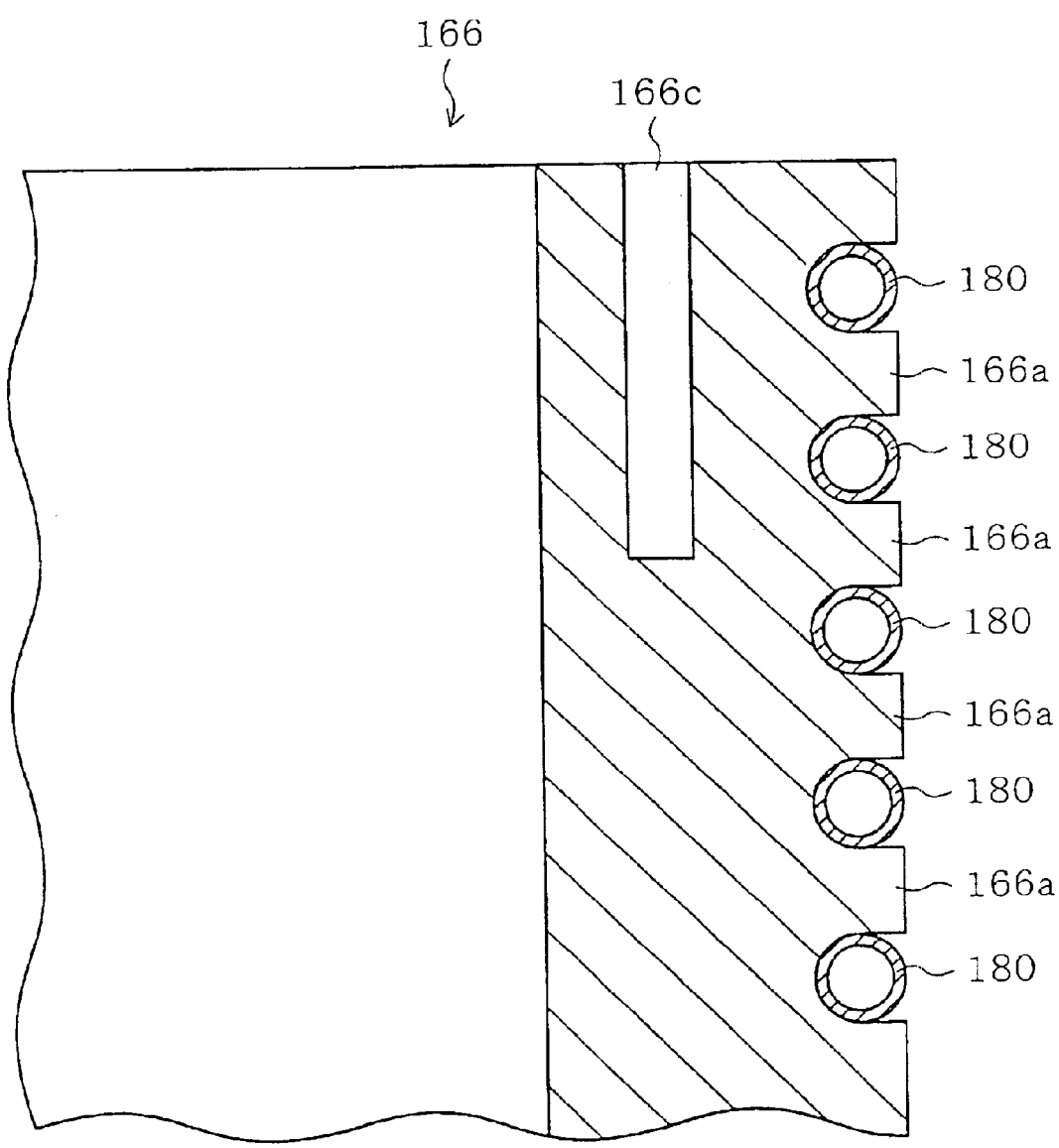
FIG. 14 is an enlarged explanatory view explaining a case of providing the tubes, assuming that the cross-sectional shape of the groove portions on the outer circumferential wall is half-round.

It is preferable to make the cross-sectional shape of the groove portions 166b half-round to fit the shape of the outer circumference of the tubes 180 as shown in FIG. 14. Consequently, a contact area between the surface of the tubes 180 and the surface of the groove portions 166b is expanded, which enables the outer circumferential wall 166 to be cooled quickly.

Figure 15:
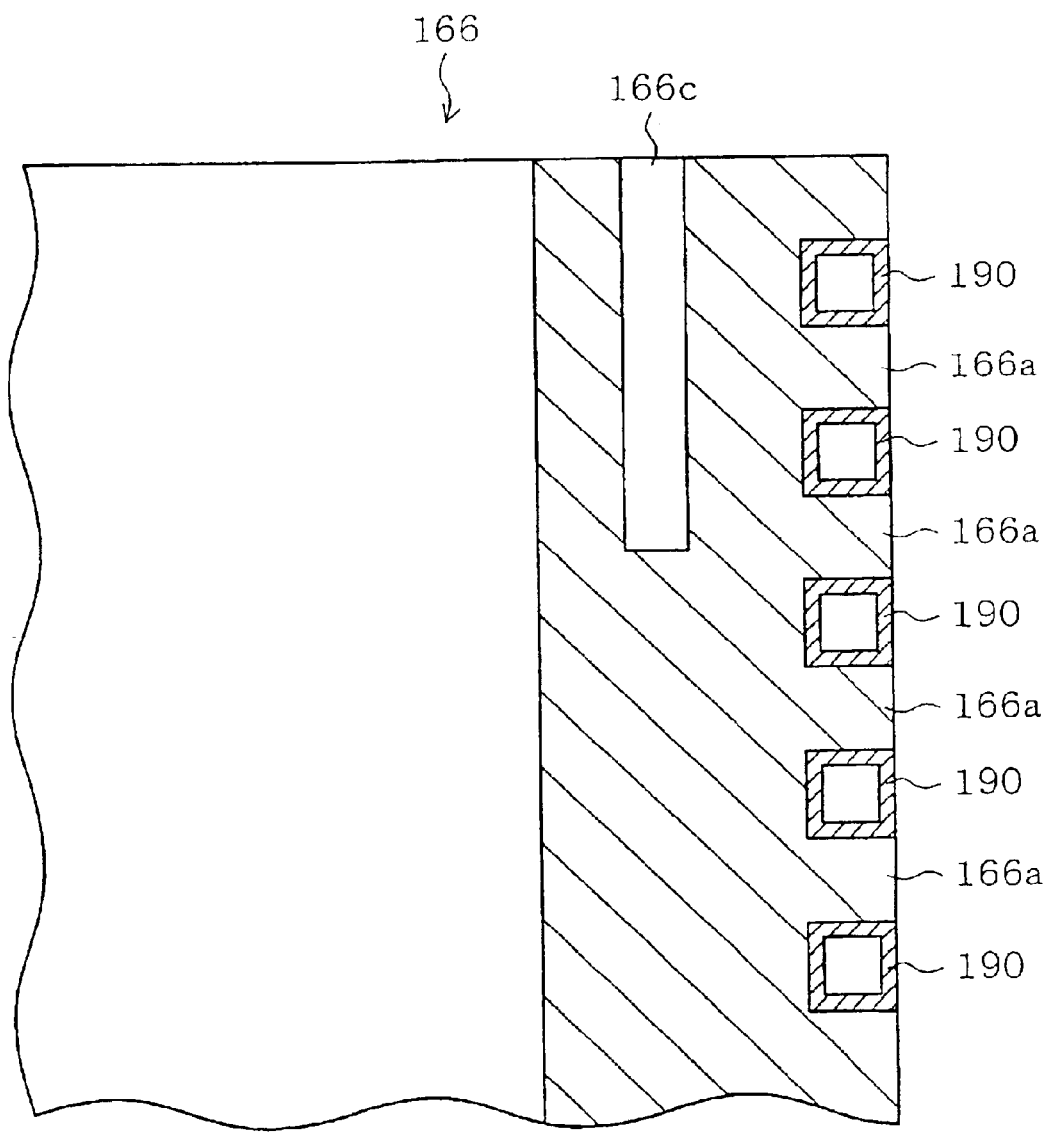
FIG. 15 is an enlarged explanatory view explaining a case where the cross-sectional shape of the tube provided in the groove portion on the outer circumferential wall is a rectangle.

Further, the cross-sectional shape of tubes 190 may be a rectangle while the cross-sectional shape of the groove portions 166b is kept rectangular as shown in FIG. 15. As a result, a contact area between the surface of the tubes 190 and the surface of the groove portions 166b is also expanded, which enables the outer circumferential wall 166 to be cooled quickly.

Figure 16:
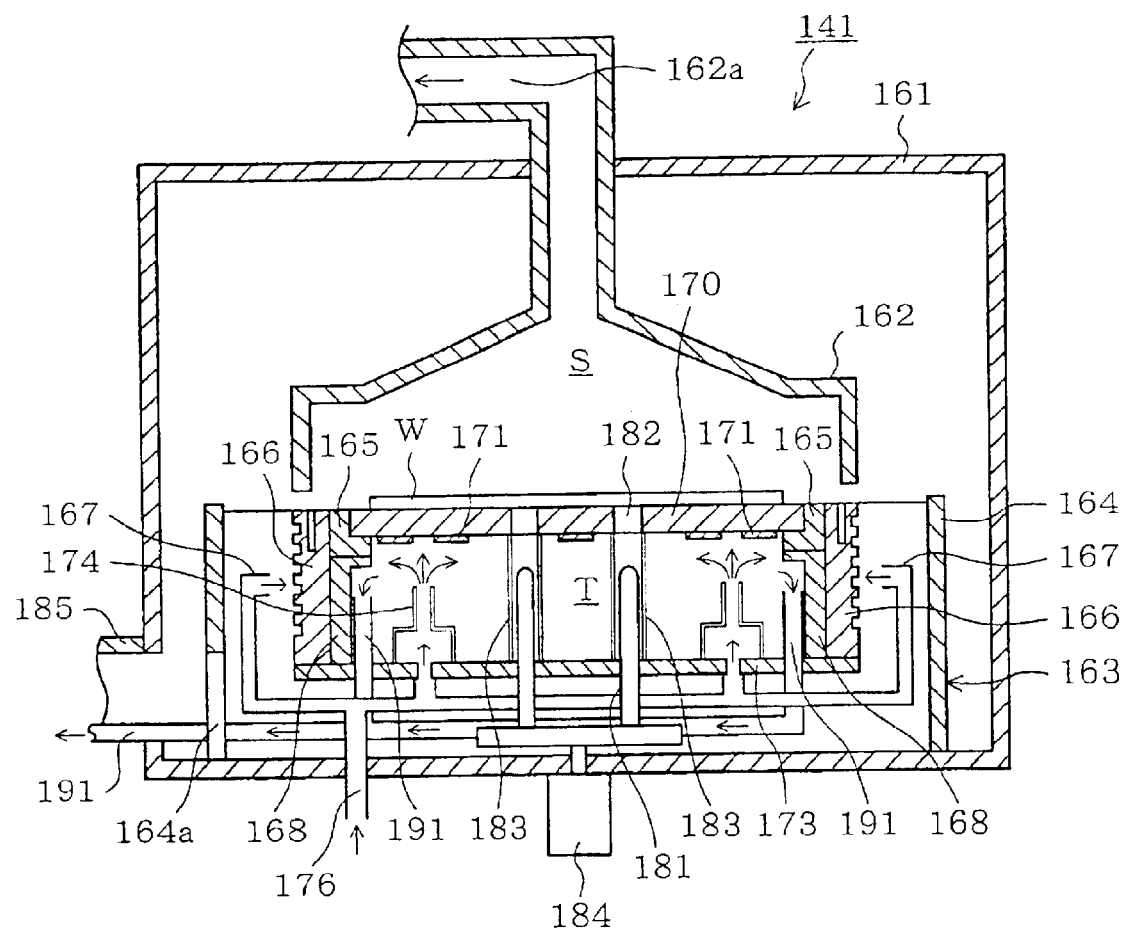
FIG. 16 is a sectional explanatory view of the post-exposure baking unit according to another embodiment of the present invention, which is provided with an exhaust duct below the heat plate, taking its side view.

Another example shown in FIG. 16 is that of the post-exposure baking unit 141 having exhaust ducts 191 for exhausting an atmosphere in the space section T below the heat plate 170 to the outside. In this case, the inside of the space section T below the heat plate 170 is a closed space. When air is blown from the nozzles 174 to rapidly cool the heat plate 170, the atmosphere inside of the space section T is exhausted to the outside through the exhaust ducts 191. Consequently, it is possible to prevent particles from rising and contaminating surroundings thereof inside of the space section T. Incidentally, the exhaust ducts 191 are closed when the wafer is placed on the heat plate 170 and heated. As a result, the atmosphere inside of the space section T can be prevented from leaking to the outside, whereby heating efficiency of the heat plate 170 is improved.

Figure 17:
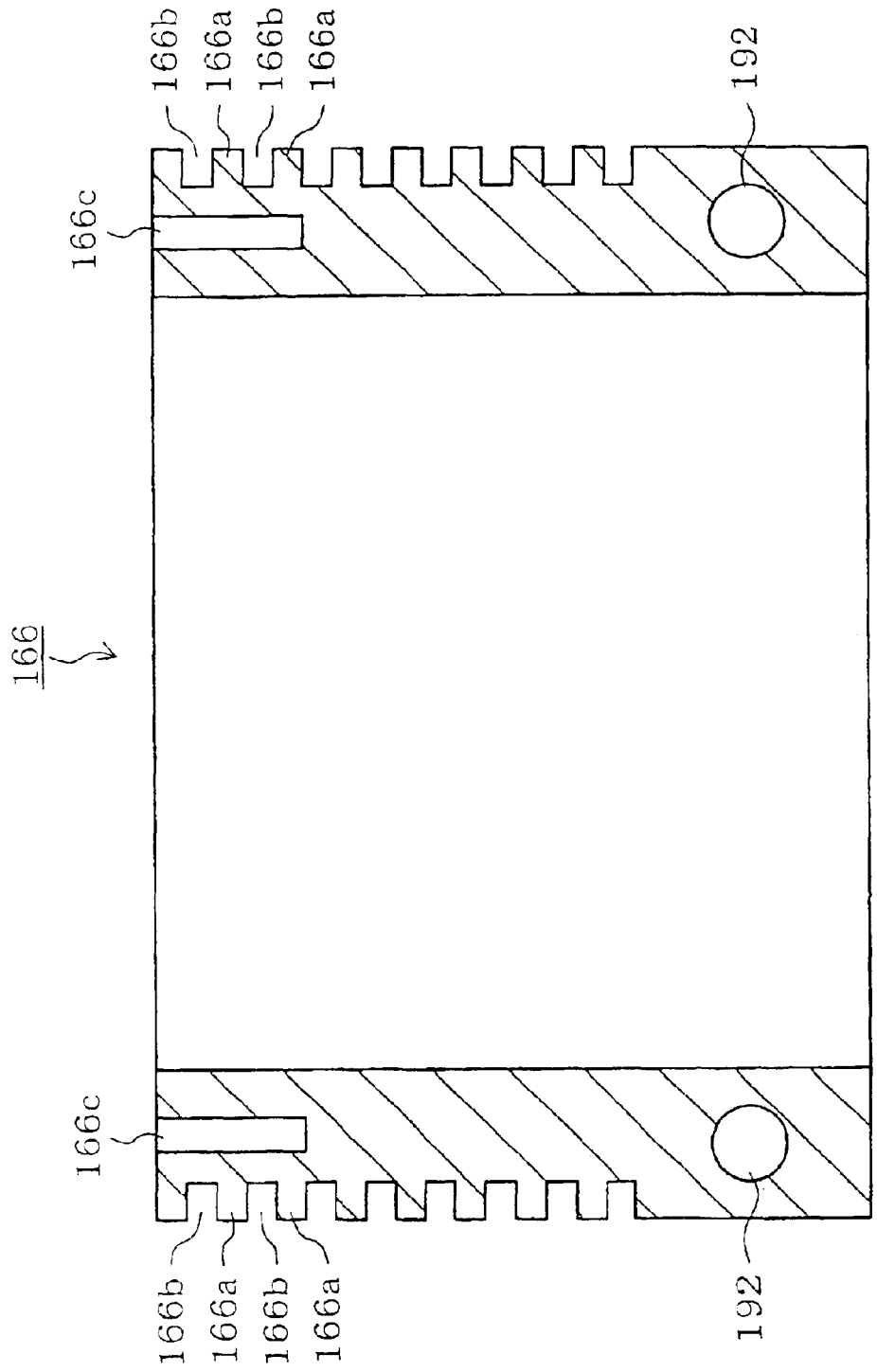
FIG. 17 is an enlarged explanatory view explaining a case of providing a flow path for fluid for cooling inside of the outer circumferential wall.

Furthermore, a flow path 192, in which fluid for cooling circulates, may be provided inside of the outer circumferential wall 166 as shown in FIG. 17. Fluid for cooling, for example, dry air circulates in the flow path 192, thereby enabling the outer circumferential wall 166 to be efficiently cooled.

Incidentally, although the aforesaid embodiment is realized as a heat treatment unit capable of performing post-exposure baking, other heat treatment units such as prebaking unit may naturally be employed. Further, although a substrate is the wafer in the above, it is applicable to heat treatment units with other rectangular substrates, for example, an LCD substrate.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teachings of the invention.

The entire disclosure of Japanese Patent Application No. 11-278431 filed on Sep. 30, 1999 and Japanese Patent Application No. 11-278438 filed on Sep. 30, 1999 including specification, claims, drawings and summary is incorporated herein by reference in its entirety.

What is claimed is:

1. A heat treatment unit in which a substrate is heated on a heat plate, comprising:

an outer circumferential wall surrounding the outer circumference of a supporting member which supports the heat plate; and fins provided on the surface of said outer circumferential wall;

a nozzle which blows gas for cooling against a reverse side of said heat plate;

wherein said heat plate has a heating element in a predetermined pattern; and wherein said heating element is printed and exposed on the reverse side of the heat plate.

2. A heat treatment unit according to claim 1, further comprising gas supply means for supplying gas for cooling to said outer circumferential wall.

3. A heat treatment unit according to claim 1, further comprising a tube in which fluid for cooling circulates, between said fins.

4. A heat treatment unit according to claim 3, further comprising a nozzle which blows gas for cooling against the reverse side of said heat plate, gas for cooling which circulates in said tube being the gas supplied to said nozzle.

5. A heat treatment unit according to claim 4, wherein the gas is dry air.

6. A heat treatment unit according to claim 2, wherein gas supplied by said gas supply means is the gas which is supplied to said nozzle.

7. A heat treatment unit in which a substrate is heated on a heat plate, comprising:

an outer circumferential wall surrounding the outer circumference of a supporting member which supports the heat plate; and a tube provided to have contact with the surface of the outer circumferential wall, in which fluid for cooling circulates;

a nozzle which blows gas for cooling against a reverse side of said heat plate;

wherein said heat plate has a heating element in a predetermined pattern; and wherein said heating element is printed and exposed on the reverse side of the heat plate.

8. A heat treatment unit according to claim 7, wherein gas for cooling which circulates in said tube is the gas which is supplied to said nozzle.

* * * * *